United States Patent [19]
Hwang et al.

[11] Patent Number: 5,901,716
[45] Date of Patent: May 11, 1999

[54] WAFER CLEANING APPARATUS WITH ROTATING CLEANING SOLUTION INJECTION NOZZLES

[75] Inventors: Kyung-Seuk Hwang, Suwon; Jun-Kyu Lee, Pusan, both of Rep. of Korea

[73] Assignee: Samsung Electronics Co., Ltd., Suwon, Rep. of Korea

[21] Appl. No.: 08/768,709

[22] Filed: Dec. 18, 1996

[30] Foreign Application Priority Data

Dec. 29, 1995 [KR] Rep. of Korea ...................... 95-65736

[51] Int. Cl.⁶ ............................................ B08B 3/02
[52] U.S. Cl. ........................ 134/25.4; 134/180; 134/186; 134/902; 239/242
[58] Field of Search .................... 134/180, 172, 134/902, 187, 188, 191, 186, 102.2, 199, 193, 194, 74, 25.4; 239/242, 264, 263.3, 263

[56] References Cited

U.S. PATENT DOCUMENTS

| | | |
|---|---|---|
| 1,927,665 | 9/1933 | Kirby ........................................ 134/186 |
| 2,725,064 | 11/1955 | Tamminga ................................ 134/180 |
| 3,178,117 | 4/1965 | Hanifan . |
| 4,092,176 | 5/1978 | Kozai et al. .............................. 134/902 |
| 4,753,258 | 6/1988 | Seiichiro .................................. 134/902 |
| 5,000,206 | 3/1991 | Kramer et al. ........................... 134/144 |
| 5,069,235 | 12/1991 | Vetter et al. ............................. 134/902 |
| 5,378,308 | 1/1995 | Thoms ..................................... 134/199 |
| 5,437,296 | 8/1995 | Citino ...................................... 134/144 |
| 5,520,205 | 5/1996 | Guldi et al. ............................... 134/902 |
| 5,547,247 | 8/1996 | Kakatani et al. ......................... 134/902 |
| 5,657,927 | 8/1997 | Bushman et al. ........................ 134/180 |

FOREIGN PATENT DOCUMENTS

| | | | |
|---|---|---|---|
| 2207191 | 8/1973 | Germany ............................... 134/181 |
| 6-89889 | 3/1994 | Japan ..................................... 134/902 |
| 109718 | 2/1944 | Sweden .................................. 134/181 |
| 447499 | 3/1968 | Switzerland ........................... 134/181 |
| 782894 | 11/1980 | U.S.S.R. ................................. 134/199 |

*Primary Examiner*—Frankie L. Stinson
*Attorney, Agent, or Firm*—Jones & Volentine, L.L.P.

[57] ABSTRACT

A wafer cleaning apparatus includes at least one nozzle fixing tube disposed in a wall of a cleaning bath. A plurality of injection nozzles are arranged on the nozzle fixing tube for spraying a compressed cleaning solution toward the wafer. A rotating device rotates the at least one nozzle fixing tube and the plurality of injection nozzles within a predetermined angle.

7 Claims, 2 Drawing Sheets

WAFER CLEANING APPARATUS WITH ROTATING CLEANING SOLUTION INJECTION NOZZLES

BACKGROUND OF THE INVENTION

1. Field of the Invention

The present invention relates to a wafer cleaning apparatus, and more particularly, to an improved wafer cleaning apparatus which is capable of upgrading wafer cleaning effectiveness by spraying a cleaning solution in varying directions towards a wafer.

2. Description of the Related Art

In semiconductor fabricating processes, the wafer cleaning procedure is basically directed to preventing the surface of a wafer from being contaminated by contaminants such as organic substances, dust or the like, because scrupulously clean wafers are critical for obtaining high yields in very large scale integration (VLSI) fabrication.

Generally, in the wafer cleaning procedure, a wafer is immersed in a sulfuric acid ($H_2SO_4$)-hydrogen peroxide ($H_2O_2$) mixture to remove organic contaminants or ionic contaminants adhered thereto, and then is rinsed in deionized water to repel acid or alkali.

In order to upgrade the effectiveness of the rinsing procedure using deionized water, a sequence of step are carried out, including for example, a pre-rinsing step during which deionized water is filled to capacity in a cleaning bath then quickly dumped, a dump rinsing step during which deionized water and nitride gas $N_2$ are cooperatively used to remove dust, or the like, from the surface of the wafer, and a post-rinsing step during which the wafer is placed in flowing water.

A quick dump rinsing (QDR) step can be utilized to quickly and cleanly rinse contaminants such as a chemical or the like existing on the surface of a wafer. Referring to FIG. 1, there is illustrated a conventional wafer cleaning apparatus including a QDR bath. The conventional wafer cleaning apparatus 10 includes a cleaning bath 2 in which a wafer (not shown) is received to be cleaned by deionized water and nitride gas $N_2$, a plurality of spaced-apart injection nozzles 4 vertically arranged at both side walls of the cleaning bath 2, and a plurality of spaced-apart holes 6 formed at the bottom surface of the cleaning bath 2 to allow the deionized water and the nitride gas $N_2$ to be introduced and dumped therethrough.

In the wafer cleaning apparatus 10 constructed as mentioned above, after the wafer having contaminants adhered thereon is placed in the cleaning bath 2, the deionized water and the nitride gas $N_2$ are supplied through the plurality of holes 6 into the cleaning bath 2 to first remove contaminants from the wafer. In the course of draining the deionized water and the nitride gas $N_2$, when the wafer is exposed to the outside, more deionized water is sprayed onto the wafer through the plurality of injection nozzles 4 at a high pressure to clean the wafer again. These cleaning operations using the deionized water and the nitride gas $N_2$ are implemented for three to five cycles.

However, the conventional wafer cleaning apparatus has a drawback in that since the plurality of injection nozzles 4 are fixed in one direction, it is possible that a portion of the wafer may not be wetted by the sprayed water, resulting in an insufficient cleaning procedure. If the pressure of the sprayed water is reduced, the effectiveness of wafer cleaning procedure is further deteriorated. Moreover, since the same cleaning cycles are repeatedly used, additional time is needed to complete the cleaning procedure such that productivity is lowered remarkably.

SUMMARY OF THE INVENTION

Accordingly, the present invention has been constructed in an effort to solve one or more of the problems occurring in the conventional art. It is an object of the present invention to provide a wafer cleaning apparatus which is capable of upgrading wafer cleaning effectiveness by spraying a cleaning solution at varying directions toward a wafer.

According to one aspect of the present invention, there is provided a wafer cleaning apparatus comprising: a cleaning bath for receiving a wafer to be cleaned, the cleaning bath having a plurality of openings through which a cleaning solution may be supplied thereto or drained therefrom; at least one nozzle fixing tube disposed in a wall of the cleaning bath; a plurality of injection nozzles arranged on the nozzle fixing tube for spraying a compressed cleaning solution toward the wafer; and rotating means for rotating the plurality of injection nozzles within a predetermined angle.

According to another aspect of the present invention, the rotating means includes: a pair of spaced apart cylinders communicating with an air compressor via a pair of tubes, respectively, such that compressed air is a alternately supplied to or discharged from the pair of cylinders; a pair of reciprocating pistons disposed in the pair of cylinders, respectively; a pair of rack members securely fastened to a surface of the pair of pistons, respectively; and a pinion member rotatably intermeshed with the pair of rack members, with the at least one nozzle fixing tube being fastened to the pinion member to be integrally rotated with the pinion member.

The pinion member may be rotated in one of a clockwise or counter-clockwise direction. The plurality of injection nozzles arranged on the nozzle fixing tube integrally rotate with the nozzle fixing tube fastened to the rotating pinion member.

With the features of the present invention, since a plurality of injection nozzles for spraying a cleaning solution toward a wafer can be rotated clockwise or counter-clockwise, wafer cleaning effectiveness can be upgraded, and thereby processing time can be shortened.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENT

Figure 1:
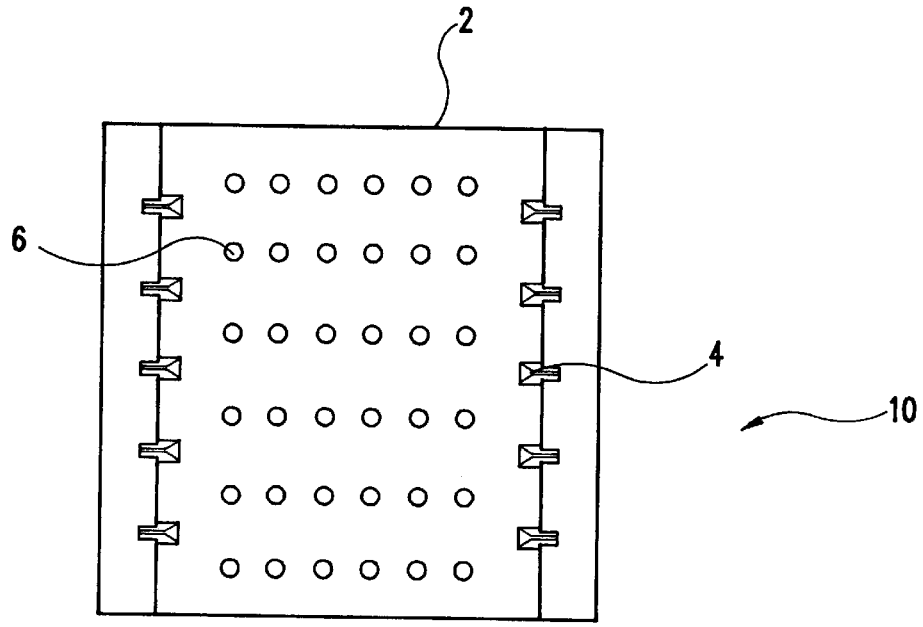
FIG. 1 is a plan view of a conventional wafer cleaning apparatus.

A wafer cleaning apparatus in accordance with a preferred embodiment of the present invention will be described in greater detail with reference to FIGS. 2 through 4.

The wafer cleaning apparatus 100 according to the present invention includes a cleaning bath 20 in which a wafer (not shown) is received to be cleaned by a cleaning solution such as deionized water and nitride gas $N_2$. At the bottom surface of the cleaning bath 20, there are formed a plurality of holes 22 through which the deionized water and the nitride gas $N_2$ can be introduced and drained. Nozzle fixing tubes 32 are disposed at both side walls of the cleaning bath 20, and a plurality of spaced-apart injection nozzles 30 are rotatably fixed to the nozzle fixing tubes 32. Each nozzle fixing tube 32 is connected to a rotating device 40 which rotates the nozzle fixing tube 32 to thereby allow the plurality of injection nozzles 30 to be rotated.

Figure 3:
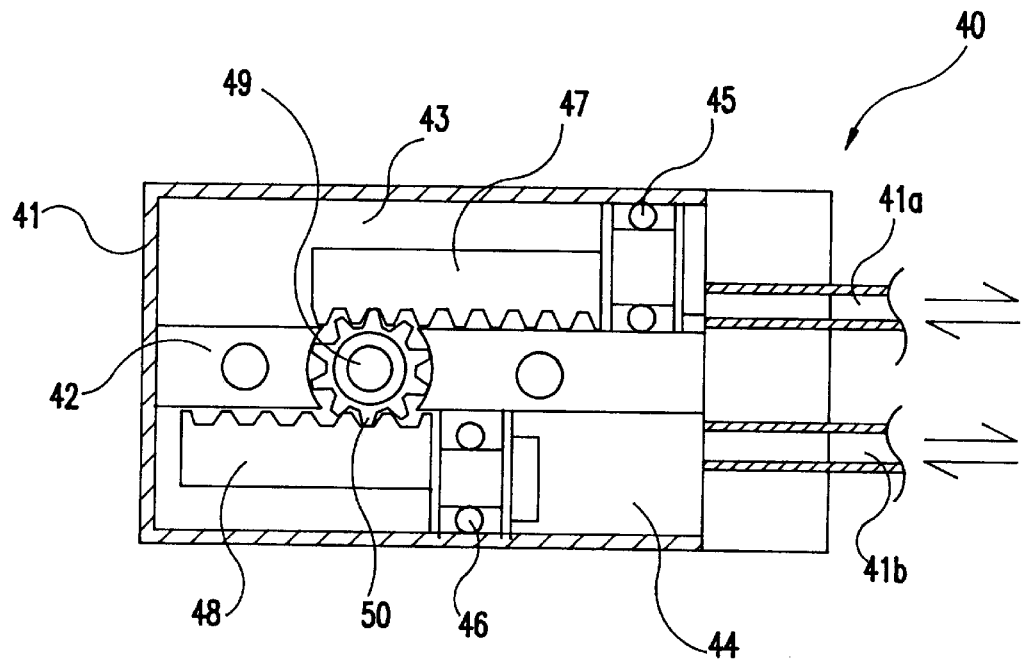
FIG. 3 is a cross-sectional view illustrating a rotating device used isthe wafer cleaning apparatus of FIG. 2.
Figure 4:
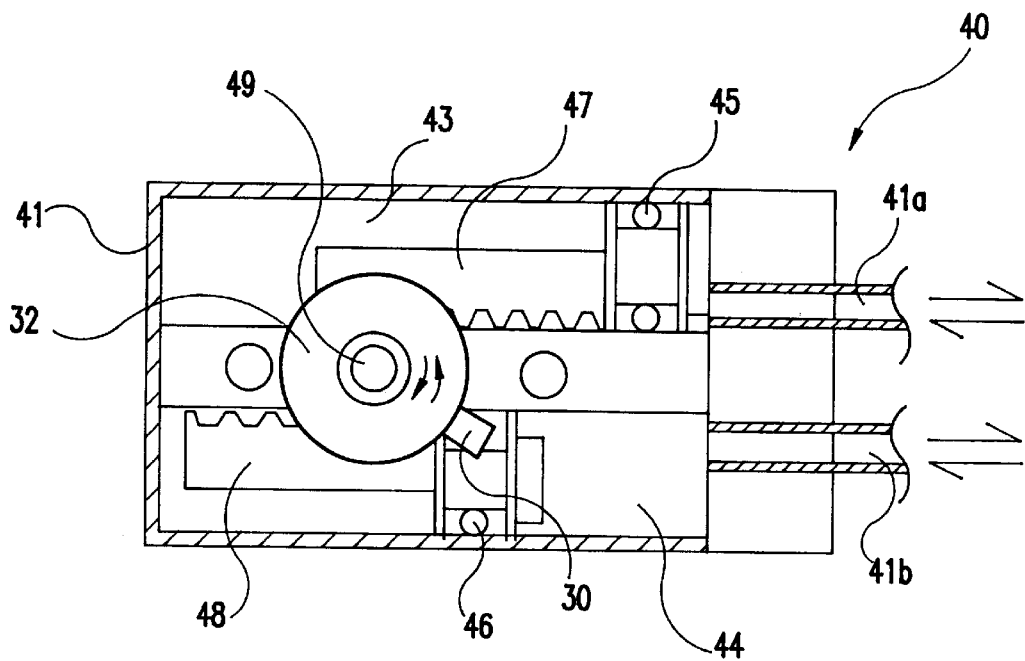
FIG. 4 is a cross-sectional view illustrating the state in which an injection nozzle is rotated by the rotating device of FIG. 3.

Referring to FIGS. 3 and 4, the rotating device 40 includes a housing 41, having a space within the housing 41 that is divided into two by a partition wall 42 to define a pair of cylinders 43 and 44. The pair of cylinder 43 and 44 communicate with an air compressor (not shown) via a pair of air tubes 41a and 41b, respectively. Air flow through the air tubes 41a and 41b is controlled by solenoid valves (not shown) in such a manner that air is alternately supplied to or discharged from the pair of cylinders 43 and 44. A pair of pistons 45 and 46 are disposed in the pair of cylinders 43 and 44, respectively, to be sealingly reciprocated therein.

A pair of rack members 47 and 48 are fastened to the surfaces of the pistons 45 and 46, respectively, opposing the air tubes 41a and 41b, so as to be integrally moved therewith when the pistons 45 and 46 are moved by the alternate supplying and discharging of the compressed air into and from the cylinders 43 and 44. A rotating shaft 49 is rotatably supported by the partition wall 42, and a pinion member 50 is securely fastened to the circumferential outer surface of the rotating shaft 49. The pair of rack members 47 and 48 are intermeshed with the pinion member 50 of the rotating shaft 49. As shown in FIG. 4, the nozzle fixing tube 32 is fixedly secured to the rotating shaft 49 to be integrally rotated therewith within a predetermined angle according to the reciprocating movement of the rack members 47 and 48.

The operation of the wafer cleaning apparatus 100 according to the present invention, constructed as mentioned above, is explained in detail below.

Figure 2:
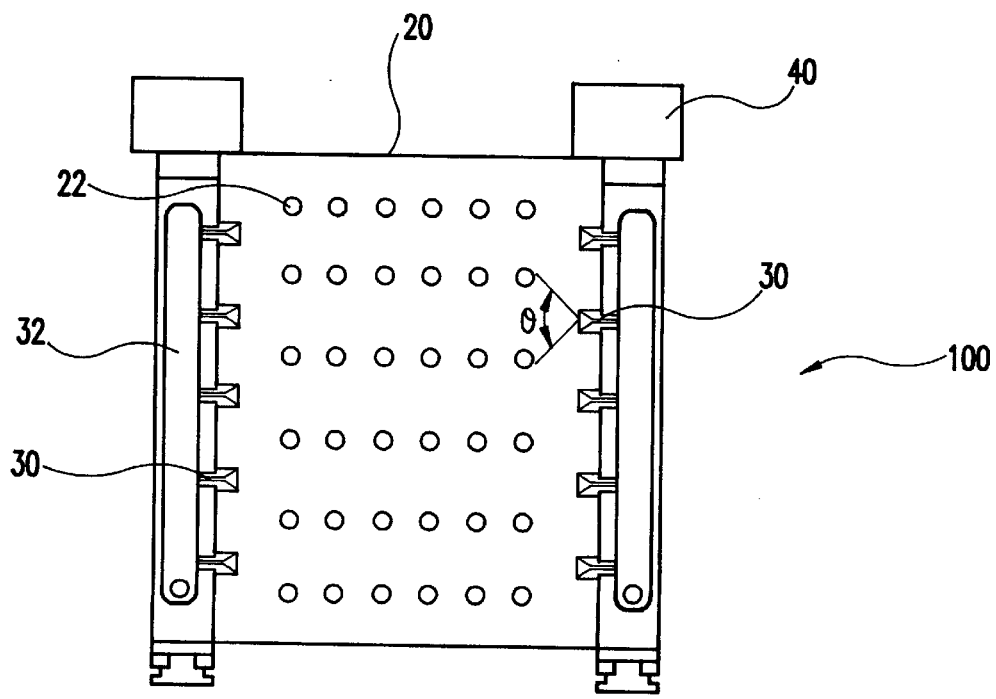
FIG. 2 is a plan view of a wafer cleaning apparatus in accordance with an embodiment of the present invention.

After the wafer is placed in the cleaning bath 20, the cleaning solution such as deionized water and nitride gas $N_2$ is introduced into the cleaning bath 20 through the plurality of holes 22 formed at the bottom surface of the cleaning bath 20 to allow the wafer to be sufficiently submerged in the cleaning solution, so that the contaminants such as a chemical or the like adhered to the surface of the wafer are first removed (see FIG. 2).

Then, the deionized water and the nitride gas $N_2$ are dumped through the plurality of holes 22. In the course of dumping the deionized water and the nitride gas $N_2$, when the wafer is exposed to the outside, the air compressor is operated to supply the highly compressed air into the cylinder 43 through the air tube 41a (see FIGS. 3 and 4). By supplying the highly compressed air, the piston 45 and the rack member 47 integrally move inward in the cylinder 43 toward one end of the housing 41 opposite to the air tube 41a. In this case, the pinion member 50 intermeshed with the rack member 47 is rotated in a counter-clockwise direction. At this time, the piston 46 and the rack member 48 arranged in another cylinder 44 are moved outward toward air tube 41b, such that the air contained in the cylinder 44 is discharged through the air tube 41b. After the air in the cylinder 44 is completely discharged, a new charge of highly compressed air is supplied into the cylinder 44 through the air tube 41b, by which the piston 46 and the rack member 48 are moved inward, and the pinion member 50 intermeshed with the rack member 48 is rotated in a clockwise direction. Solenoid valves control the air flow through the air tubes 41a and 41b to alternately supply the highly compressed air into the cylinders 43 and 44, respectively. The nozzle fixing tube 32, which is securely fastened to the rotating shaft 49, rotates in conjunction with the rotation of the rotating shaft 49 and pinion member 50. The plurality of injection nozzles 30, rotatably fixed to the nozzle fixing tube 32, are thus rotated within a predetermined angle to spray the cleaning solution such as deionized water and nitride gas $N_2$, to thereby clean the wafer again.

Accordingly, it is possible not only to remove the contaminants adhered to the surface of the wafer, but also to prevent other contaminants from adhering to a portion of the wafer when the wafer is exposed to the outside. It is understood that the range of motion of the pistons will determine the rotation arc of the pinion member 50, which then determines the spraying angle θ of the injection nozzles 30 (see FIG. 2). Spraying angles θ can range from 0° to 180°. Also, when the spraying angle of the plurality of injection nozzles 30 is set, for example, to a range between 45° and 90°, the actual spraying operation can cover an angle of greater than 90°.

As a result, by the wafer cleaning apparatus according to the present invention, since a plurality of injection nozzles for spraying a cleaning solution toward a wafer can be rotated clockwise or counter-clockwise, wafer cleaning effectiveness can be upgraded, and thereby processing time can be shortened.

While the present invention has been described and illustrated with reference to a preferred embodiment thereof, it is to be readily understood that the present invention is not limited to the embodiment, and various changes and modifications can be made therein without departing from the spirit and scope of the invention defined in the appended claims.

What is claimed is:

1. A wafer cleaning apparatus, comprising:

a cleaning bath for receiving a wafer to be cleaned, said cleaning bath having a plurality of openings through which a cleaning solution may be supplied thereto or drained therefrom;

at least one nozzle fixing tube disposed in a wall of said cleaning bath;

a plurality of injection nozzles arranged on said nozzle fixing tube for spraying a compressed cleaning solution toward said wafer;

a rotating means for rotating said nozzle fixing tube within a predetermined angle, thereby rotating said plurality of injection nozzles within a predetermined angle, the rotating means comprising;

a pair of spaced apart cylinders communicating with an air compressor via a pair of air tubes, respectively, such that compressed air is alternately supplied to or discharged from said pair of cylinders;

a pair of reciprocating pistons disposed in said pair of cylinders, respectively;

a pair of rack members securely fastened to a surface of said pair of pistons, respectively; and a pinion member rotatably intermeshed with said pair of rack members, said at least one nozzle fixing tube being fastened to said pinion member to be integrally rotated with said pinion member.

2. A wafer cleaning apparatus as claimed in claim 1, wherein said pinion member may be rotated in one of a clockwise or counter-clockwise direction.

3. A wafer cleaning apparatus as claimed in claims 2, wherein said plurality of injection nozzles arranged on said at least one nozzle fixing tube integrally rotate with said at least one nozzle fixing tube fastened to said rotating pinion member.

4. A wafer cleaning apparatus as claimed in claim 1, wherein said predetermined angle is less than 45°.

5. A wafer cleaning apparatus as claimed in claim 1, wherein said predetermined angle is greater than 90°.

6. A wafer cleaning apparatus as claimed in claim 1, wherein said predetermined angle is in a range of 45° to 90°.

7. A method of cleaning a wafer using rotating cleaning solution injection nozzles, the method comprising the steps of:

receiving a wafer in a cleaning bath having a plurality of openings through which a cleaning solution may be supplied thereto or drained therefrom;

supplying and discharging compressed air, alternatively, to a pair of spaced apart cylinders having respective reciprocating pistons disposed therein;

securing a rack member to each of said pistons, said rack members being movable in response to the reciprocating pistons;

intermeshing a pinion member with the rack members, said pinion member rotating in one of a clockwise or counter clockwise direction in response to said movement of the rack members;

securing at least one nozzle fixing tube to said pinion member to be integrally rotated with said pinion member;

arranging a plurality of injection nozzles on said at least one nozzle fixing tube, said plurality of nozzles rotating with said at least one nozzle fixing tube secured to said rotating pinion member.

* * * * *